United States Patent [19]
Jekel

[11] Patent Number: 5,451,948
[45] Date of Patent: Sep. 19, 1995

[54] APPARATUS AND METHOD FOR COMBINING ANALOG AND DIGITAL AUTOMATIC GAIN CONTROL IN RECEIVERS WITH DIGITAL SIGNAL PROCESSING

[75] Inventor: Richard N. Jekel, La Mesa, Calif.

[73] Assignee: Cubic Communications, Inc., San Diego, Calif.

[21] Appl. No.: 203,229

[22] Filed: Feb. 28, 1994

[51] Int. Cl.$^6$ .............................................. H03M 1/18
[52] U.S. Cl. .................................................. 341/139
[58] Field of Search ............... 341/139, 127, 131, 136, 341/143, 160; 360/51, 46, 32

[56] References Cited

U.S. PATENT DOCUMENTS

| | | |
|---|---|---|
| 4,829,593 | 5/1989 | Hara . |
| 4,831,378 | 5/1989 | Baars et al. . |
| 4,875,045 | 10/1989 | Lynch et al. ........................ 341/139 |
| 4,963,969 | 10/1990 | Kitaura et al. . |
| 4,989,074 | 1/1991 | Matsumoto . |
| 5,029,182 | 7/1991 | Cai et al. . |
| 5,075,687 | 12/1991 | Chen et al. . |
| 5,146,155 | 9/1992 | Trinh Van et al. . |
| 5,157,493 | 10/1992 | Hamon et al. . |
| 5,179,353 | 1/1993 | Miyake . |
| 5,187,481 | 2/1993 | Hiller . |
| 5,206,647 | 4/1993 | Stone . |
| 5,210,610 | 5/1993 | Kanashiki et al. . |
| 5,384,671 | 1/1995 | Fisher ..................................... 360/51 |

OTHER PUBLICATIONS

An-302 Application Note, *Analog Devices*, 1993 Applications Reference Manual, pp. 3–103, Jun. 13, 1991.

*Primary Examiner*—Brian K. Young
*Attorney, Agent, or Firm*—Brown, Martin, Haller & McClain

[57] ABSTRACT

Two automatic gain control (AGC) loops are connected by a feedforward signal. An intermediate frequency (IF) filter may be located between the output of the front-end loop and the input of the back-end loop. Stability and responsiveness are improved because neither AGC loop includes a narrowband filter. The front-end loop may include an analog gain-controlled element, but the remainder of the invention may be implemented digitally. The front-end loop prevents overloading of the A/D converter that feeds the gain-controlled signal to the remainder of the invention, and the back-end loop compensates for actions taken in the front-end loop.

30 Claims, 2 Drawing Sheets

APPARATUS AND METHOD FOR COMBINING ANALOG AND DIGITAL AUTOMATIC GAIN CONTROL IN RECEIVERS WITH DIGITAL SIGNAL PROCESSING

BACKGROUND OF THE INVENTION

The present invention relates generally to automatic gain control circuits and, more specifically, to automatic gain control circuits used in radio receivers having digital signal processing.

Automatic gain control (AGC) systems for radio receivers are well-known. AGC systems typically include an amplitude detector, a filter or integrator in a feedback path, and one or more gain-controlled amplifiers operating at radio frequencies (RF) and/or intermediate frequencies (IF). The purpose of AGC is to maintain the output signal approximately at a constant level as the RF signal varies over a wide range. It is known that for an AGC loop to maintain constant bandwidth over a wide range of input signals, the amplifier control characteristic must be such that the gain is an exponential function of the control input, which is typically expressed as a voltage. In other words, the control input must have a logarithmic relationship to the desired gain. If this condition is met, a plot of gain versus control input will be a straight line, and the characteristic is described as log-linear. The log axis is commonly stated in decibels (dB), a scaled logarithmic unit. High frequency receivers having an AGC range ("dynamic range") of up to approximately 125 dB are known in the art.

Conventional receivers have analog circuitry throughout for amplification, filtering, frequency translation (mixing), and detection (demodulation). Although an AGC circuit can easily be designed for such receivers, it is well-known that a design tradeoff exists between responsiveness and stability. To provide responsiveness, the receiver IF filter is commonly included within the AGC feedback loop. However, the presence of poles from the IF filter within the feedback loop inherently decreases stability. To avoid instability that would otherwise be introduced by the poles from the IF filter, the bandwidth of the AGC loop is commonly made very narrow.

Newer receivers may use a combination of analog and digital signal processing to improve performance and manufacturability with maximal economy. Typically, such receivers have an analog input section for amplifying a weak RF input signal and converting it to a (lower) IF. The receiver digitizes the IF signal using an analog-to-digital (A/D) converter and performs the final frequency translation, filtering, and demodulation functions digitally.

The relatively narrow dynamic range of economical A/D converters reduces the utility of conventional analog AGC circuits in receivers having both analog and digital signal processing because the dynamic range of the IF signal would need to be reduced to accommodate the A/D converter before performing AGC. To illustrate this point, it is desirable to provide at least 125 dB dynamic range in such receivers. Economical A/D converters generally have a maximum of 16 bits of resolution, yielding a maximum dynamic range of less than 98 dB between signal and a noise floor. It is a desirable design practice, however, to limit the dynamic range of the signal to about 65 dB to maintain a suitable signal-to-noise ratio (SNR). Therefore, it would be desirable in such a receiver to perform AGC while reducing the input signal dynamic range by about 60 dB in the analog input section to accommodate an economical 16 bit A/D converter. These problems and deficiencies are clearly felt in the art and are solved by the present invention in the manner described below.

SUMMARY OF THE INVENTION

The present invention comprises a front-end AGC loop and a back-end AGC loop with a signal feeding forward from the front-end loop to the back-end loop. The present invention may be used in a radio receiver that has an IF filter between the output of the front-end loop and the input of the back-end loop.

A RF/IF input section consisting of analog circuitry receives a RF input signal, amplifies it, and converts it to a (lower frequency) IF signal. The gain of the RF/IF input section amplifier is controllable. An A/D converter digitizes the IF signal and provides the digitized signal to the front-end AGC loop, which produces a front-end feedback signal to control the gain of the analog RF/IF section amplifier. Thus, the front-end AGC loop automatically adjusts the amplitude of the IF signal to maintain it within the dynamic range of the A/D converter.

The narrowest IF filter of the receiver may be between the two AGC loops, rather than within an AGC loop as is common in conventional receivers. The IF filter receives the gain-controlled output of the RF/IF section and provides a filtered IF signal to the back-end AGC loop, which produces a back-end feedback signal. The back-end feedback signal represents the total gain of the AGC system. The back-end AGC loop has a digital controllable-gain element, such as a multiplier. The front-end feedback signal is fed forward to the back-end AGC loop, which subtracts the front-end feedback signal from the back-end feedback signal. The resultant signal is provided to the digital controllable-gain element. The back-end AGC loop automatically adjusts the amplitude of the filtered IF signal to compensate for amplitude adjustments performed by the front-end AGC loop. Thus, the present invention maintains a substantially constant output signal level while preventing overloading of the A/D converter.

Stability is maximized because neither AGC feedback loop includes a narrowband IF filter, which would otherwise introduce poles (in the S-plane) into the AGC loop. The back-end loop does not include any filter and, although the front-end loop may include a roofing filter for establishing an upper bound on receiver bandwidth, such a filter is wider than the widest IF filter bandwidth. The linkage between the front-end loop and the back-end loop is feedforward, not feedback, and thus has no effect on stability. The present invention eliminates the tradeoff between responsiveness and stability inherent in AGC circuits known in the art because signal leveling is postponed until after the IF filter.

The present invention may also be used to provide an accurate indication of signal strength. If log-linear gain characteristics are maintained in both the front-end and back-end AGC loops, the back-end feedback signal, which represents the total gain of the AGC system, provides an accurate indication of signal strength over the entire dynamic range of the system.

With the exception of the portions of the present invention that are specifically described as analog circuitry or as digital circuitry, any portion of the present invention may be constructed using any suitable hardware, software or combination thereof, including programmable signal processors and discrete digital logic circuitry with discrete integrated circuits, programmable logic circuits, or custom integrated circuits.

The present invention accommodates dynamic range limitations of an A/D converter, avoids side effects from undesired signals, maximizes both stability and responsiveness, and can provide an accurate indication of signal strength. The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF THE PREFERRED EMBODIMENT

Figure 1:
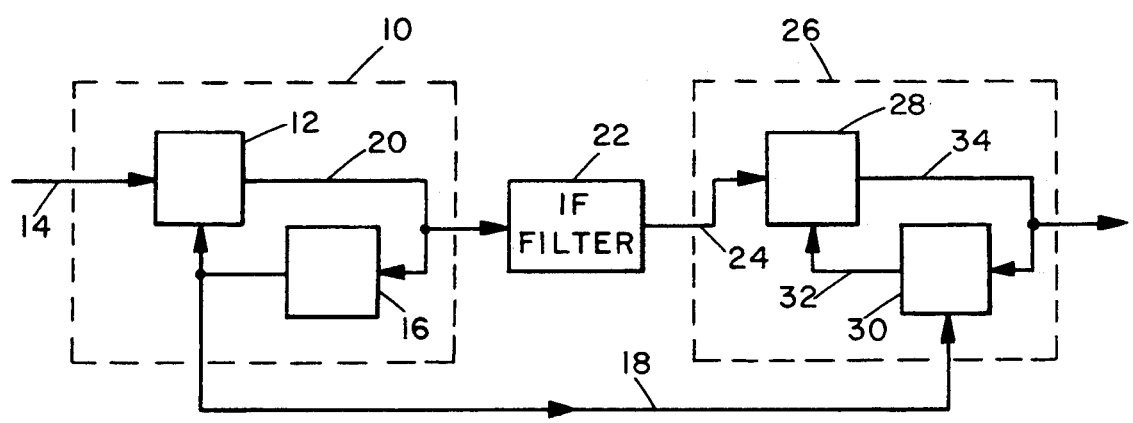
FIG. 1 is a schematic block diagram of an AGC system with two AGC loops and a feedforward signal from one loop to the other.

As shown in FIG. 1, a front-end AGC loop 10 comprises a front-end amplitude controlling means 12 for controlling the amplitude of an input signal 14 and a front-end control signal generating means 16 for producing a front-end amplitude control signal 18. Amplitude controlling means 12 provides a front-end gain-controlled signal 20, which is fed back to amplitude control signal generating means 16. An IF filter 22 also receives front-end gain-controlled signal 20 and provides a filtered gain-controlled signal 24. A back-end AGC loop 26 comprises a back-end amplitude controlling means 28 for controlling the amplitude of filtered gain-controlled signal 24 and a back-end control signal generating means 30 for producing a back-end amplitude control signal 32. Amplitude controlling means 28 provides a back-end gain-controlled signal 34, which is fed back to amplitude control signal generating means 30. Front-end amplitude control signal 18 is fed forward to back-end control signal generating means 30, which produces back-end amplitude control signal 32 in response to a combination of signal 34 and signal 18.

Figure 2:
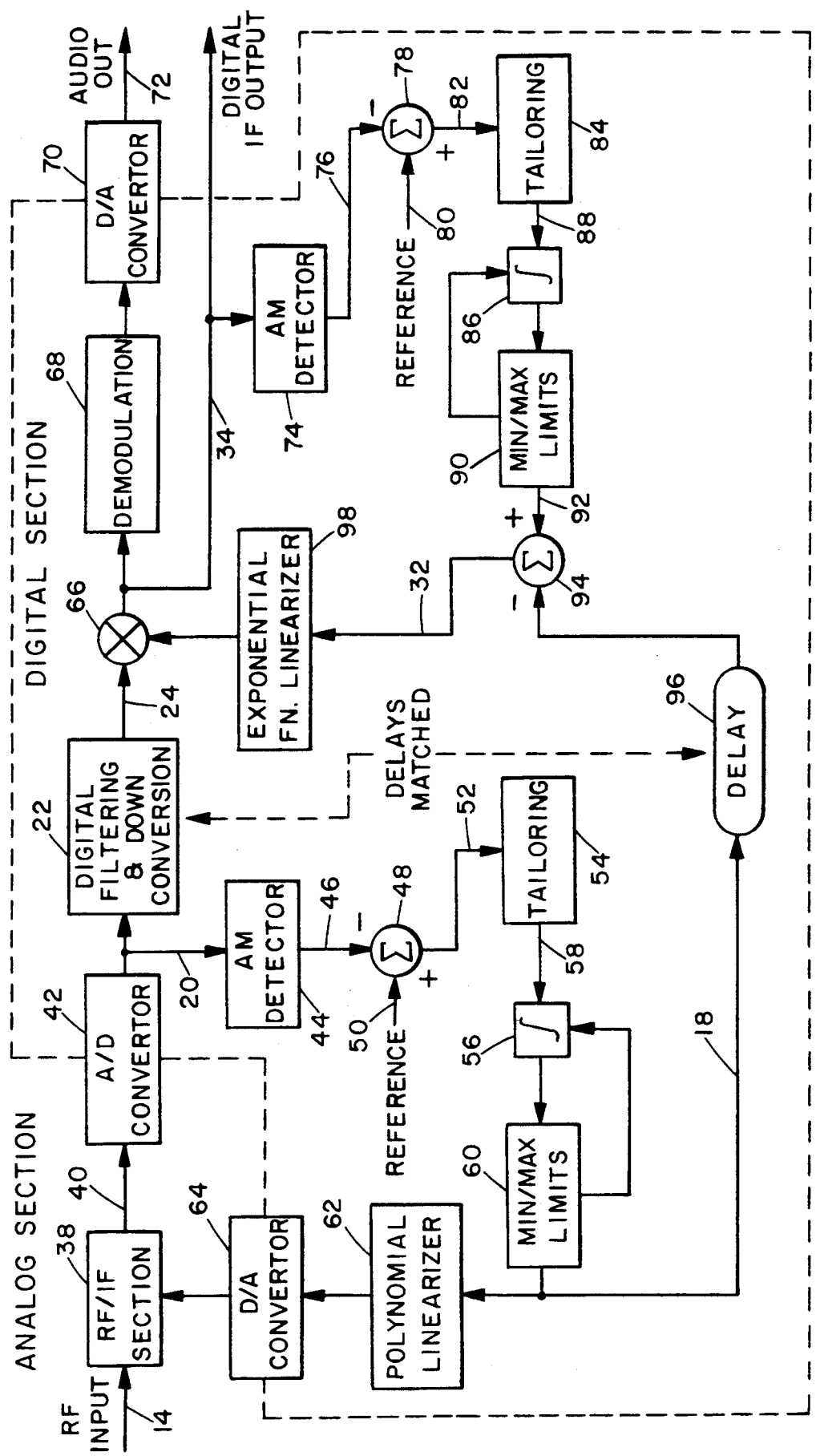
FIG. 2 is a schematic block diagram of the AGC system of FIG. 1, showing an embodiment of the AGC loops.

A suitable front-end AGC loop 10 and back-end AGC loop 26 are illustrated in FIG. 2. An analog RF/IF section 38 receives input signal 14, amplifies the weak RF signal in accordance with front-end amplitude control signal 18, and converts it to a fixed (lower frequency) IF signal 40. RF/IF section 38 preferably includes a suitable fixed bandwidth "roofing" filter (not shown), such as a quartz crystal filter, for establishing an upper bound on receiver bandwidth.

An A/D converter 42 digitizes IF signal 40 to provide front-end gain-controlled signal 20. Front-end gain-controlled signal 20 is provided both to IF filter 22 and to suitable means for estimating signal level, such as a front-end amplitude modulation (AM) detector 44. AM detector 44 may digitally sum the squares of several successive samples of signal 20, thereby providing a front-end signal level estimate signal 46 substantially equivalent to that of an analog square-law AM detector.

A front-end summing means 48 subtracts signal level estimate signal 46 from a predetermined front-end reference signal 50 to produce a front-end amplitude error difference signal 52. Thus, amplitude error difference signal 52 is positive when signal level estimate 46 is less than reference signal 50, i.e., when the AGC system of the present invention is in "decay" mode, and amplitude error difference signal 52 is negative when signal level estimate 46 is greater than reference signal 50, i.e., when the AGC system of the present invention is in "attack" mode. The amplitude error is self-limiting in the positive direction because it can never be more positive than reference signal 50.

Figure 3:
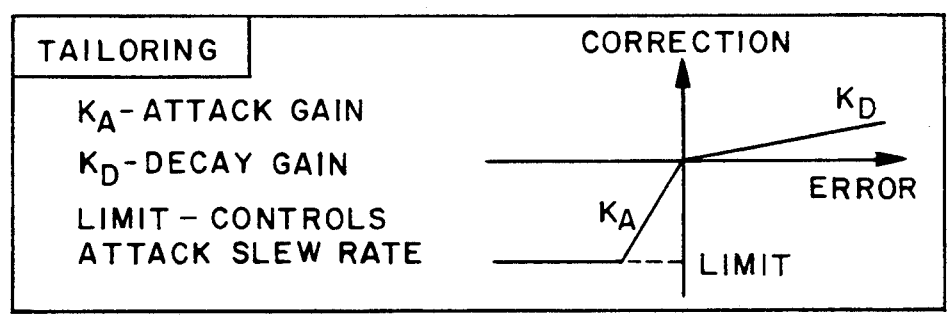
FIG. 3 illustrates a tailoring function of an AGC loop.

A front-end tailoring means 54 applies a non-linear gain or "tailoring," as it is commonly referred to in the art, to amplitude error difference signal 52. The tailoring, shown in FIG. 3, provides: a low gain ($K_D$) for positive values of amplitude error difference signal 52, thereby providing a slow AGC decay; a high gain ($K_A$) for negative values of amplitude error difference signal 52 up to a predetermined limit, thereby providing a rapid AGC attack; and a fixed negative value for negative values of amplitude error difference signal beyond the predetermined limit. The limiting prevents extremely strong signals, suddenly applied, from reducing the gain so fast that the front-end AGC loop overshoots and throws the AGC system into a slow decay mode.

A digital integrator 56 integrates the front-end tailored error signal 58. Because front-end amplitude control signal 18 is limited to a predetermined range, a front-end limiting means 60 provides minimum and maximum limits to integrator 56 that correspond to that range. The range is preferably between 60 and 65 dB to accommodate a 16 bit A/D converter 42. When no strong signal 58 is present, the output of integrator 56 will hold at the maximum gain value to maximize gain and minimize receiver noise figure. The result of the integration represents the desired front-end gain in logarithmic units. Although this result may be converted to analog form, scaled, and provided directly to RF/IF section 38, it is preferable to provide it to a front-end linearizer 62 to compensate for any non-linearities in the analog circuitry of RF/IF section 38. Linearizer 62 may comprise any suitable means, such as a polynomial calculation. A front-end D/A converter 64 converts the linearized control signal to analog form and provides it to RF/IF section 38. The combination of linearizer 62 and the gain control circuit of RF/IF section 38 have a control sensitivity (in dB per digital unit) that is predetermined and substantially constant.

In the above-described embodiment, front-end AGC loop 10 thus comprises RF/IF section 38, A/D converter 42, AM detector 44, summing means 48, tailoring means 54, integrator 56, limiting means 60, linearizer 62, and D/A converter 64.

IF filter 22 is between front-end AGC loop 10 and back-end AGC loop 26. IF filter 22 receives the output of A/D converter 42. IF filter 22 may be any suitable type of digital filter known in the art and, as will be recognized by those skilled in the art, may comprise multiple discrete and selectable filters as well as a frequency translator. The final filter of IF filter 22 may be substantially narrower in bandwidth than the roofing filter of RF/IF section 38. IF filter 22 is preferably either implemented in floating point arithmetic or carries enough bits of integer precision to accommodate the fairly wide dynamic range of the signal at this point in the system. IF filter 22 also has an inherent time delay, the value of which can easily be determined. IF filter 22 may provide output samples at a lower sample rate than that of A/D converter 42 and in complex form rather than real.

A digital multiplier 66 multiplies filtered gain-controlled signal 24 by back-end amplitude control signal 32 to produce back-end gain-controlled signal 34. Back-end gain-controlled signal 34 may be provided in digital form directly to other digital signal processing devices (not shown) or may be provided to a demodulator 68 and a back-end D/A converter 70 to reproduce the transmitted audio frequency signal 72.

In a manner similar to that described above with respect to front-end loop 10, back-end gain-controlled signal 34 is provided to a suitable means for estimating signal level, such as a back-end amplitude modulation (AM) detector 74. AM detector 74 may digitally sum the squares of several successive samples of signal 34, thereby providing a back-end signal level estimate signal 76 substantially equivalent to that of an analog square-law AM detector. If the signal is in quadrature (I,Q) baseband form, the amplitude detector may implement the sum of the squares of I and Q or the square-root thereof if the true amplitude is preferred.

A back-end summing means 78 subtracts signal level estimate signal 76 from a predetermined back-end reference signal 80 to produce a back-end amplitude error difference signal 82. Thus, amplitude error difference signal 82 is positive when signal level estimate 76 is less than reference signal 80, i.e., when the AGC system of the present invention is in decay mode, and amplitude error difference signal 82 is negative when signal level estimate 46 is greater than reference signal 80, i.e., when the AGC system of the present invention is in attack mode. The amplitude error is self-limiting in the positive direction because it can never be more positive than reference signal 80.

A back-end tailoring means 84 applies a non-linear tailoring in the same manner as discussed above with respect to front-end tailoring means 54.

A back-end digital integrator 86 integrates the tailored back-end error signal 88. Because the total gain of the receiver is limited to a predetermined range, a back-end limiting means 90 provides minimum and maximum limits to integrator 86 that correspond to that range. The range may be manually selected by an operator according to the type of modulation to be received.

The result of the back-end integration represents the desired total gain 92 of the receiver in logarithmic units. These units should have the same scale factor as the front-end gain values, discussed above.

A total gain summing means 94 subtracts front-end amplitude control signal 18, which represents the front-end gain of the receiver, from total gain 92 to produce back-end amplitude control signal 96. A suitable digital delay line 96 having a delay equal to that of IF filter 22 may be interposed in signal 18 between front-end AGC loop 10 and back-end AGC loop 26 to equalize the delays.

A back-end linearizer 98 performs an exponential function on back-end amplitude control signal 96 to provide the necessary log-linear relationship. A function of $2^x$ is preferred because that function may conveniently be implemented in digital logic. Using such a function as the scaling factor, the output of back-end linearizer 98 is log-linear with a sensitivity of 6.02 dB per digital unit (for a total gain span in the receiver of 21.25 digital units). Front-end linearizer 62 should provide the same sensitivity factor over the 60.2 dB analog control range, for a span of 10 digital units.

In the above-described embodiment, back-end AGC loop 26 thus comprises multiplier 66, AM detector 74, summing means 78, tailoring means 84, integrator 86, limiting means 90, total gain summing means 94, and linearizer 98.

In considering the operation of the present invention it should be noted that the bandwidth of front-end AGC loop 10 is wider than the bandwidth of back-end AGC loop 26 but narrower than the bandwidth of IF filter 22. If, while receiving a moderate strength desired signal within the bandpass of the selected filter of IF filter 22, a very strong signal were to appear within the bandwidth of the roofing filter but not IF filter 22, the present invention would cause several effects. Front-end AGC loop 10 would react quickly to keep the strong signal from overloading A/D converter 42, and both the undesired and desired signals would rapidly drop in amplitude at the output of A/D converter 42. In addition, in the output of IF filter 22 the desired signal amplitude would drop rapidly, but after the time delay created by filter 22. IF filter 22 filters out the undesired signal. Through feedforward, the rapidly changing gain of RF/IF section 38 is provided to back-end AGC loop 26 via digital delay line 96. Because the value of this delay equalizes the delay through IF filter 22, back-end AGC loop 26 increases its gain, which is represented by back-end amplitude control signal 32, at the proper rate and precise time required to compensate for the action taken in front-end AGC loop 10. For this compensation to be accurate, the sensitivities of AGC loops 10 and 26 should be matched over their entire operating range. This compensation prevents back-end gain-controlled signal 34 from dropping abruptly upon the appearance of the undesired signal and then recovering at a rate determined by the bandwidth of back-end AGC loop 26. It also prevents the reverse action when the undesired signal vanishes. At all times it minimizes stress in back-end AGC loop 26 caused by actions in front-end AGC loop 10.

It should also be noted that total gain 92 accurately corresponds to the level of the received signal over the entire dynamic range if linearizers 62 and 98 produce an accurate log-linear relationship. Thus, total gain 92 could be provided directly to a signal strength readout (not shown).

Obviously, other embodiments and modifications of the present invention will occur readily to those of ordinary skill in the art in view of these teachings. Therefore, this invention is to be limited only by the following claims, which include all such other embodiments and modifications when viewed in conjunction with the above specification and accompanying drawings.

I claim:
1. An automatic gain control system, comprising:
a first automatic gain control (AGC) loop for receiving an input signal, for producing a first gain controlled-signal, and for producing a first control signal in response to said first gain-controlled signal, said first gain-controlled signal produced in response to said input signal and said first control signal;

a filter for filtering said first gain-controlled signal and for providing a filtered first gain-controlled signal; and a second automatic gain control (AGC) loop for producing a second gain-controlled signal and for producing a second control signal in response to said second gain-controlled signal and said first control signal, said second gain-controlled signal produced in response to said filtered first gain-controlled signal and said second control signal.

2. The automatic gain control system recited in claim 1, wherein said first AGC loop comprises:

an analog gain-controlled amplifier for producing said first gain-controlled signal in response to said input signal and said first control signal; and an analog-to-digital (A/D) converter connected to said gain-controlled amplifier for receiving said first gain-controlled signal and for producing a digital first gain-controlled signal.

3. The automatic gain control system recited in claim 2, wherein said first AGC loop further comprises a digital-to-analog (D/A) converter connected to said first gain-controlled amplifier for controlling the gain of said gain-controlled amplifier in response to said first control signal.

4. The automatic gain control system recited in claim 2, wherein said first AGC loop further comprises a first amplitude modulation (AM) detector for receiving said digital first gain-controlled signal and for producing a first signal level estimate.

5. The automatic gain control system recited in claim 4, wherein said first AGC loop further comprises a first amplitude error corrector for producing a first correction signal in response to said first signal level estimate and a first predetermined reference signal.

6. The automatic gain control system recited in claim 5, wherein said first amplitude error corrector comprises a first summer for producing a first difference signal equal to the difference between said first signal level estimate and said first predetermined reference signal.

7. The automatic gain control system recited in claim 6, wherein:

said first AGC loop further comprises tailoring for producing a first tailored correction signal;

said first tailored correction signal is produced in response to a first function of said first difference signal when said first AGC loop is in a decay mode; and said first tailored correction signal is produced in response to a second function of said first difference signal when said first AGC loop is in an attack mode.

8. The automatic gain control system recited in claim 7, wherein:

said first function has a constant decay gain greater than one; and said second function has a constant attack gain greater than one only between a value of said first tailored correction signal equal to zero and a value of said first tailored correction signal equal to a predetermined correction limit.

9. The automatic gain control system recited in claim 7, wherein said first AGC loop further comprises:

an integrator for integrating said first tailored correction signal; and a limiter for limiting said integrated first tailored correction signal.

10. The automatic gain control system recited in claim 7, wherein said first AGC loop further comprises a linearizer for linearizing said first gain-controlled signal with respect to an exponential function of said first control signal.

11. The automatic gain control system recited in claim 1, wherein said second AGC loop comprises a digital multiplier for producing said first gain-controlled signal in response to said first gain-controlled signal and said second control signal.

12. The automatic gain control system recited in claim 11, wherein said second AGC loop further comprises:

total gain means for producing a total gain signal in response to said second gain-controlled signal; and summing means for producing said second control signal in response to the difference between said total gain signal and said first control signal.

13. The automatic gain control system recited in claim 12, wherein said total gain means comprises a second amplitude modulation (AM) detector for receiving said digital second gain-controlled signal and for producing a second signal level estimate.

14. The automatic gain control system recited in claim 13, wherein said total gain means further comprises a second amplitude error corrector for producing a second correction signal in response to said second signal level estimate and a second predetermined reference signal.

15. The automatic gain control system recited in claim 14, wherein said second amplitude error corrector comprises summing means for producing a second difference signal equal to the difference between said second signal level estimate and said second predetermined reference signal.

16. The automatic gain control system recited in claim 14, wherein:

said total gain means further comprises tailoring means for producing a second tailored correction signal;

said second tailored correction signal is produced in response to a first function of said second difference signal when said second AGC loop is in a decay mode; and said second tailored correction signal is produced in response to a second function of said second difference signal when said second AGC loop is in an attack mode.

17. The automatic gain control system recited in claim 16, wherein:

said first function has a constant decay gain greater than one; and said second function has a constant attack gain greater than one only between a value of said second tailored error correction signal equal to zero and a value of said second tailored error correction signal equal to a predetermined correction limit.

18. The automatic gain control system recited in claim 16, wherein said total gain means further comprises:

an integrator for integrating said second tailored correction signal; and a limiter for limiting said integrated second tailored correction signal.

19. The automatic gain control system recited in claim 16, wherein said total gain means further comprises scaling means for linearizing said second gain-controlled signal with respect to an exponential function of said second control signal.

20. The automatic gain control system recited in claim 19, wherein said exponential function is $2^x$, and wherein x is said second control signal.

21. An automatic gain control system, comprising:
   a first automatic gain control (AGC) loop having a bandwidth, said first AGC loop for receiving a radio frequency input signal and for producing an intermediate frequency (IF) first gain-controlled signal;
   an IF filter having a bandwidth wider than said bandwidth of said first AGC loop, said IF filter for receiving said first gain-controlled signal and for producing a filtered first gain-controlled signal; and
   a second automatic gain control (AGC) loop having a bandwidth narrower than said bandwidth of said first AGC loop, said second AGC loop for receiving said filtered first gain-controlled signal and for producing a second gain-controlled signal.

22. The automatic gain control system recited in claim 21, further comprising a demodulator for producing a demodulated output signal in response to said second gain-controlled signal.

23. The automatic gain control system recited in claim 21, wherein:
   said narrowband IF filter is a digital filter;
   said first AGC loop comprises analog gain-controlled means;
   said first AGC loop produces a first control signal in response to said first gain-controlled signal;
   said first AGC loop produces said first gain-controlled signal produced in response to said input signal and said first control signal;
   said second AGC loop comprises digital gain-controlled means;
   said second AGC loop produces a second control signal in response to said second gain-controlled signal and said first control signal; and
   said second AGC loop produces said gain-controlled signal produced in response to said first gain-controlled signal and said second control signal.

24. The automatic gain control system recited in claim 23, wherein said first and second AGC loops each comprise:
   amplitude modulation (AM) detection means connected to said gain-controlled means of said respective AGC loop;
   amplitude error correction means connected to said AM detection means;
   tailoring means connected to said amplitude error correction means;
   limited integrator means connected to said tailoring means; and
   linearizer means connected to said limited integrator means.

25. A method for providing automatic gain control in a receiver having digital signal processing circuitry, comprising the steps of:
   detecting the amplitude of an input signal and producing a first gain signal in response to said detection;
   controlling said amplitude of said input signal in response to said first gain signal;
   providing a digital signal having said controlled amplitude to a digital intermediate frequency (IF) filter;
   detecting the amplitude of a filtered signal and producing a second gain signal in response to said detection; and
   controlling said amplitude of said filtered signal in response to said first and second gain signals.

26. The method for providing automatic gain control recited in claim 25, wherein:
   said step of controlling said amplitude of said input signal comprises the step of providing said first gain signal to an analog gain-controlled amplifier; and
   said step of controlling said amplitude of said filtered signal comprises the step of providing said second gain signal to a digital multiplier.

27. The method for providing automatic gain control recited in claim 26, wherein each of said detecting steps comprises the steps of:
   detecting an amplitude; and
   forming the difference between said amplitude and a reference signal.

28. The method for providing automatic gain control recited in claim 27, wherein each of said detecting steps further comprises the step of tailoring said difference.

29. The method for providing automatic gain control recited in claim 28, wherein each of said detecting steps comprises the step of integrating said tailored difference.

30. The method for providing automatic gain control recited in claim 29, wherein each of said detecting steps further comprises the step of linearizing the respective one of said gain signals in response to said tailored and integrated difference.

* * * * *